United States Patent
Alphonse

[11] Patent Number: 6,097,743
[45] Date of Patent: Aug. 1, 2000

[54] SUPERLUMINESCENT DIODE AND OPTICAL AMPLIFIER WITH WAVELENGTH STABILIZATION USING WDM COUPLERS AND BACK OUTPUT LIGHT

[75] Inventor: Gerard A. Alphonse, Princeton, N.J.

[73] Assignee: Sarnoff Corporation, Princeton, N.J.

[21] Appl. No.: 09/159,154

[22] Filed: Sep. 23, 1998

Related U.S. Application Data

[60] Provisional application No. 60/089,470, Jun. 16, 1998.

[51] Int. Cl.[7] .......................................... H01S 3/13
[52] U.S. Cl. ............................... 372/32; 372/38
[58] Field of Search .................... 372/9, 29, 32, 372/33, 34, 38

[56] References Cited

U.S. PATENT DOCUMENTS

| | | | |
|---|---|---|---|
| 4,450,565 | 5/1984 | Copeland | 372/32 |
| 4,583,228 | 4/1986 | Brown et al. | 372/32 |
| 4,713,821 | 12/1987 | Bradford et al. | 372/44 |
| 4,789,881 | 12/1988 | Alphonse | 357/17 |
| 4,793,679 | 12/1988 | Toda et al. | 350/96.15 |
| 4,821,276 | 4/1989 | Alphonse et al. | 372/45 |
| 4,821,277 | 4/1989 | Alphonse et al. | 372/45 |
| 4,842,358 | 6/1989 | Hall | 372/32 X |
| 4,856,014 | 8/1989 | Figueroa et al. | 372/46 |
| 4,958,355 | 9/1990 | Alphonse et al. | 372/45 |
| 5,008,889 | 4/1991 | Wilson | 372/32 |
| 5,311,603 | 5/1994 | Fidric | 385/11 |
| 5,321,503 | 6/1994 | Bramson | 356/350 |
| 5,388,110 | 2/1995 | Snitzer | 372/6 |
| 5,453,833 | 9/1995 | Kawashima et al. | 372/29 X |
| 5,818,857 | 10/1998 | Palmer | 372/32 |
| 5,898,502 | 4/1999 | Horiuchi et al. | 372/32 X |

*Primary Examiner*—John D. Lee
*Attorney, Agent, or Firm*—William J. Burke

[57] ABSTRACT

A wavelength division multiplexer (WDM) is used to transmit the output light from a superluminescent diode (SLD) over a band approximately equal to the full width half maximum (FWHM) SLD bandwidth and its output serves as an IFOG light source. The residual (uncoupled) spectrum contains two sidelobes, which are then separated by another WDM into a lower half centered around $\lambda_1$ and an upper half centered around $\lambda_2$. These sidelobes are detected and fed to a differential amplifier whose output is an error signal which is used in a feedback loop to control the SLD drive current or the drive current of a thermoelectric cooler (TEC) on which the SLD is mounted, both of which affect the SLD spectrum. The same results are achieved using the back output light of the SLD chip. An optical amplifier is also implemented by providing access to the front and rear faces of the SLD and splitting off a small portion of the light from one of the facets for the automatic adjustment.

17 Claims, 2 Drawing Sheets

SUPERLUMINESCENT DIODE AND OPTICAL AMPLIFIER WITH WAVELENGTH STABILIZATION USING WDM COUPLERS AND BACK OUTPUT LIGHT

This application claims the benefit of U.S. Provisional Application Ser. No. 60/089,470, filed Jun. 16, 1998.

This invention was made under U.S. Government Contract 14104 DAAH01-95-C-R173. The Government has certain rights in the invention.

BACKGROUND OF THE INVENTION

1. Field of the Invention

The present invention relates to superlurinescent diodes (SLDs). In particular, it relates to wavelength stabilization of SLDs, optical amplifiers, and other broadband light sources by comparing the output at two or more wavelengths and using an error signal for closed loop feedback for temperature or current control.

2. Description of the Prior Art

An interferometric fiber optic gyroscope (IFOG) is an instrument that measures the phase shift or time delay between counter-propagating lights injected in an optical fiber loop on a rotating platform and converts it to a measure of rotation rate. The measured phase shift, called the "Sagnac" effect, is proportional to the rotation rate. The proportionality constant, called the "scale factor", is proportional to the average wavelength of the light source. Hence, the accuracy of the IFOG is determined by the accuracy by which the average wavelength of the light source is known. Thus, the design of an interferometric fiber optic sensing system depends on the stability of the wavelength of the optical source. In particular, for the fiber optic rotation sensors to be useful in navigation, the emission wavelength of the optical source must be controlled to ten parts in a million or better.

Wavelength stabilization of the optical source has been accomplished by using a thermally-compensated optical interferometer to detect changes in the emission wavelength of the source. In a thermally-compensated interferometer, the interferometer is designed so that shifts occur in the interferometer only in response to shifts in the wavelength of the incident light and not in response to changes in ambient temperature. Shifts in the source wavelength generate an error signal in the interferometer which is used to correct the emission wavelength of the source.

In order to avoid coherence noise effects, the light source is required to have a broad bandwidth. The preferred broadband light source is the super-luminescent diode (SLD). The SLD emits in a broad spectral band which reduces phase noise in the sensor caused by the Kerr effect and by coherent backscatter in the fiber. In the SLD, the optical feedback present in laser diodes is suppressed by placing the current stripe at an angle with respect to the diode facets so that the reflected light is away from the stripe. A typical angle is about 5° to 10°. Because of the absence of feedback, these devices emit only incoherent light, the type of light that is required by the fiber optic rotation sensor. However, the SLD optical spectrum varies with temperature at a rate of about 350 ppm/° C. (parts per million per ° C.), and for navigational grade IFOGs, this variation should be reduced to below 10 ppm/° C. The temperature of the SLD is typically held to within 0.1 to 0.2° C. by means of a thermoelectric cooler (TEC), but this does not provide sufficient accuracy for navigation.

Although angled stripe SLDs are appropriate as sources for fiber optic rotation sensors, high accuracy control of the emission wavelength of these devices by interferometry is made difficult by the short coherence length (broad bandwidth) of the source. For these devices, this length is typically on the order of 20 $\mu$m to 60 $\mu$m. To generate an error signal in response to changes in the emission wavelength of the source, interferometers must therefore be designed and fabricated with optical pathlength differences on the order of the coherence length of the SLD. Such interferometers are difficult and expensive to fabricate.

What is needed is a simple means to measure the wavelength very accurately by taking advantage of the broad bandwith, and to use the information in a closed loop feedback system to continually adjust the current supplied to the drivers to maintain that value of the wavelength. The present invention has been developed for this purpose.

SUMMARY OF THE INVENTION

The present invention is directed to an optical device comprising a superluminescent diode (SLD) having a front facet and a rear facet; a first current source for exciting the SLD into emitting output light from at least one of the front facet and the rear facet; a thermoelectric cooler (TEC) mounted on the SLD; a second current source for driving the TEC; an optical fiber for receiving the output light from one of the front facet and the rear facet; and a wavelength stabilization circuit. The wavelength stabilization circuit comprises a first wavelength division multiplexer (WDM) which splits the output light from the SLD received via the optical fiber into a first band approximately equal to a full width half maximum SLD bandwidth, centered around $\lambda_c$, and a second band containing a residual spectrum containing two sidelobes, a second WDM which separates the residual spectrum into a lower half centered around $\lambda_1$, and an upper half centered around $\lambda_2$, optical detectors, and a differential amplifier responsive to the upper and lower halves so as to provide an output error signal when the upper and lower halves are not equal which is used in a feedback loop to control at least one of the first current source and the second current source.

In a further embodiment within the scope of the present invention, an optical device is provided that comprises an SLD having a front facet and a rear facet; a first current source for exciting the SLD into emitting output light from at least one of the front facet and the rear facet; a TEC mounted on the SLD; a second current source for driving the TEC; and a wavelength stabilization circuit. The wavelength stabilization circuit comprises a beam splitter for receiving the output light from one of the front facet and the rear facet of the SLD and splitting the received output light into a first path and a second path, a first light detector and a first filter in the first path, a second light detector and a second filter in the second path, and a differential amplifier responsive to filtered outputs of the first and second light detectors. The differential amplifier provides an output error signal when the filtered outputs of the first and second light detectors are not equal which is used in a feedback loop to control at least one of the first current source and the second current source.

BRIEF DESCRIPTION OF THE DRAWINGS

The present invention will be better understood after reading the following detailed description of the presently preferred embodiments thereof with reference to the appended drawings, in which:

FIG. 1(*a*) is a schematic diagram of a wavelength-stabilized superluminescent diode using two wavelength division multiplexers and closed loop feedback in accordance with a first embodiment of the present invention.

DETAILED DESCRIPTION OF THE PREFERRED EMBODIMENTS

A system and method which meets the above-mentioned objects and provides other beneficial features in accordance with the presently preferred exemplary embodiment of the invention will be described below with reference to FIGS. 1–3. Those skilled in the art will readily appreciate that the description given herein with respect to those figures is for explanatory purposes only and is not intended in any way to limit the scope of the invention.

Figures 1A, 1B, 1C:
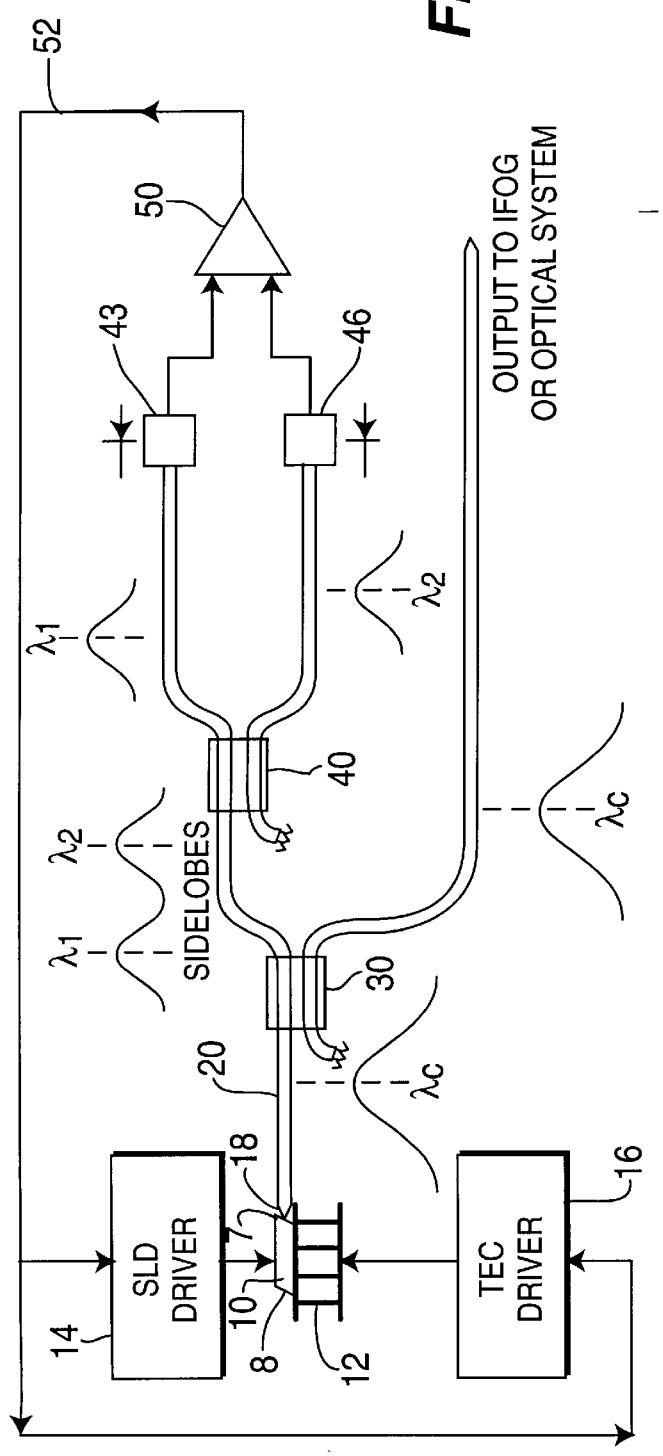
FIG. 1(b) is an output spectrum of one of the wavelength division multiplexers of FIG. 1(a) that is provided as a light source to an IFOG or other optical system.
FIG. 1(c) is an output spectrum of the sidelobes that are used in the stabilization feedback loop of FIG. 1(a).

An implementation of a closed loop feedback wavelength stabilization system in accordance with the invention is shown in FIG. 1(a). A conventional superluminescent diode (SLD) 10 having a front facet 7 and a rear facet 8 is mounted on a thermoelectric cooler (TEC) 12 in a conventional manner. An SLD driver or current source 14 drives the SLD 10, and a TEC driver or current source 16 drives the TEC 12 to adjust the temperature. Without temperature control, the temperature of the SLD 10 rises because of ohmic losses due to the applied current.

Conventionally, a thermistor (not shown) is used to sense the temperature and provides a signal to increase or decrease the output current of the TEC driver 16. As the SLD temperature increases or decreases, the thermistor causes the TEC drive current to change accordingly in order to maintain a constant temperature. However, instead of controlling the temperature, the exemplary system shown in FIG. 1 controls the wavelength directly. The output light from the front facet 7 of the SLD 10 is coupled to a fiber 20 containing two wavelength division multiplexers (WDMs) 30, 40. As shown, fiber coupling is achieved by tapering the tip 18 of the fiber 20 and bringing it within a few microns from the front facet 7 of the SLD 10. Fiber coupling can also be achieved with less stringent tolerance requirements by positioning one or two miniature lenses between the fiber 20 and the facet 7 of the SLD 10.

The WDMs 30, 40 are conventional wavelength-sensitive couplers obtained by fusing together two fibers so that the optical fields from both fibers can interact via the fused cladding region. Light propagating in the core of one fiber can be coupled into the other. Maximum coupling occurs at the wavelength for which the propagation constant is the same for both fibers. Coupling occurs over a certain bandpass determined by the phase mismatch between the two fibers. All the light from one fiber can be coupled into the other fiber if the interaction length (the fused region) is equal to half the "beat length", as is understood by those skilled in the art.

Thus, a WDM can be designed to transmit all the light from one fiber to the other over a specified bandwidth by adjusting the interaction length and the spacing between the fiber cores during the fusion step. In FIG. 1, the WDM 30 is used to transmit the output light of the SLD 10 over a band approximately equal to the full width half maximum (FWHM) SLD bandwidth, centered around $\lambda_c$ as shown in FIG. 1(b). The output that is centered around $\lambda_c$ is provided as the light source to an IFOG, for example. It should be understood that the invention has applications other than for use in IFOG systems. For example, a further application of the invention is stabilization of a multiple output laser source for dense WDM optical communication systems.

The residual (uncoupled) spectrum contains lower and upper sidelobes, centered at $\lambda_1$ and $\lambda_2$, respectively, as shown in FIG. 1(c). These two sidelobes are typically not used in the prior art and discarded. In the present exemplary embodiment of the present invention, however, the sidelobes are used for control and to achieve wavelength stabilization.

The two sidelobes are separated by WDM 40 into a lower sidelobe spectrum centered around $\lambda_1$ and an upper sidelobe spectrum centered around $\lambda_2$. These sidelobes are detected and filtered at optical detectors 43, 46, respectively, and provided to a differential amplifier 50. The differential amplifier 50 compares the two sidelobes and generates an error signal (feedback signal) representing the difference between the two sidelobes. The error signal is transmitted in a feedback loop 52 to the SLD driver 14 to control the SLD drive current and the TEC driver 16 to control the TEC drive current in order to bring the difference between the two sidelobes closer to zero. Both the SLD drive current and the TEC drive current affect the SLD output spectrum.

In operation, the differential amplifier 50 is initially zeroed such that the IFOG output center wavelength is at $\lambda_c$ at a given temperature. As the temperature or SLD current varies, the SLD output spectrum shifts which causes the relative outputs of the detectors 43, 46 to shift, thereby unbalancing the differential amplifier 50. As described above, the output of the differential amplifier 50 becomes a positive or negative signal which is used as an error signal to control the SLD driver 14 and the TEC driver 16. The process is automatic and continues until the error signal returns to zero, indicating the condition of substantially perfect balance. The system compensates for both the SLD and filter responses, even if the filter bandpass is about the same as the SLD spectrum.

It should be noted that the SLD driver 14 and the TEC driver 16 are separate and can be controlled independently to adjust the wavelength. The SLD driver 14 can be used for "fine" tuning. If the current to the SLD 10 is increased, then the output is wavelength decreased by in increments on the order of about 40 ppm/mA. This is considered a fine resolution. On the other hand, the TEC driver 16 can be used for "coarse" tuning. If the temperature of the TEC 12 is increased, then the output is wavelength increased on the order of about 350 to 400 ppm/° C.

Figure 2:
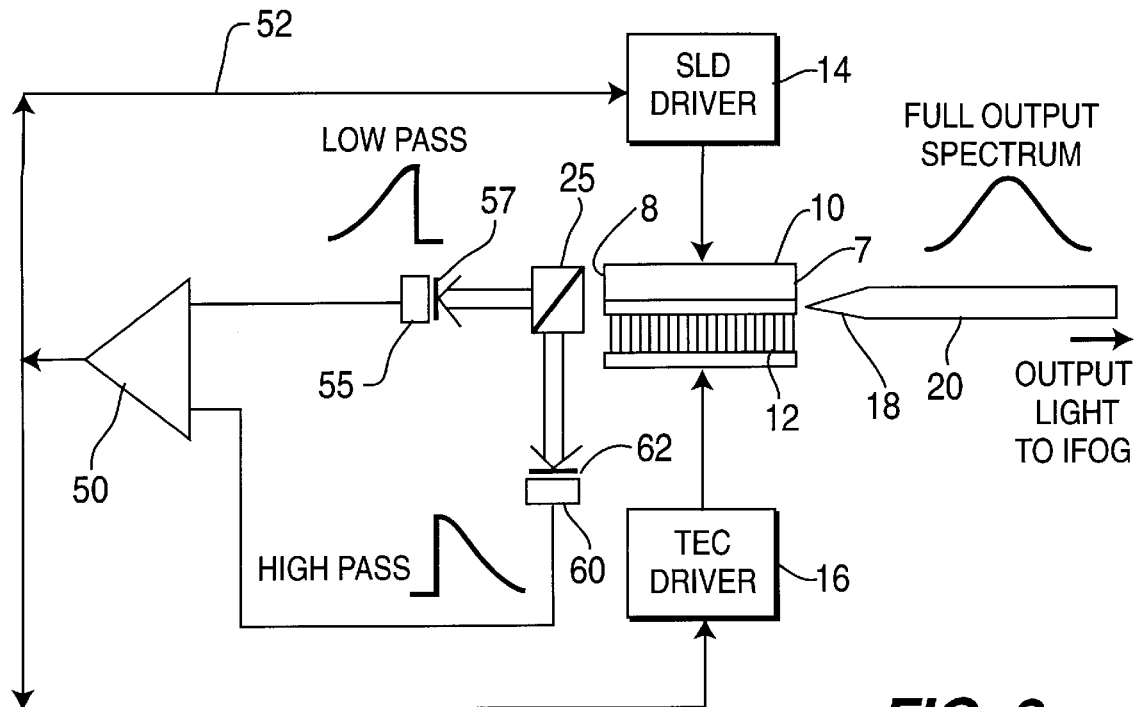
FIG. 2 is a schematic diagram of a wavelength-stabilized superluminescent diode using the back output light separation and closed loop feedback in accordance with a second embodiment of the present invention.
Figure 3:
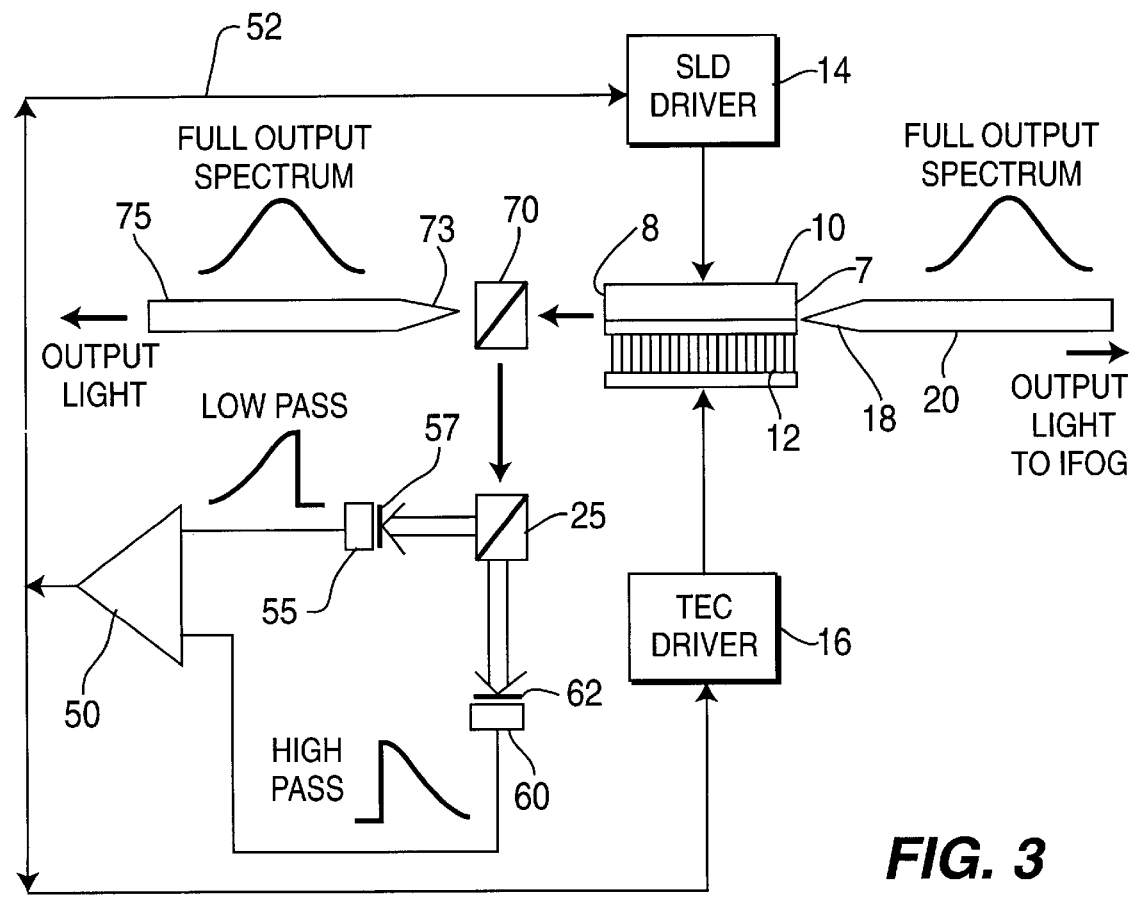
FIG. 3 is a schematic diagram of an exemplary wavelength-stabilized optical amplifier with access to both front and rear light outputs of the superluminescent diode in accordance with the present invention.

The embodiment of FIG. 2 achieves similar results as the embodiment of FIG. 1(a) except that the output light from the back facet 8 of the SLD 10 is not wasted. FIG. 2 contains elements similar to those described above with respect to FIG. 1(a). These elements are labeled identically and their description is omitted for brevity.

As described above with respect to the system of FIG. 1, one WDM 30 is used for outcoupling to the IFOG or other optical system, while the other WDM 40 is used to separate the upper and lower sidebands and to provide the desired wavelength discrimination information. Because the front facet 7 and the rear facet 8 of the SLD 10 are substantially identical, the SLD 10 emits substantially the same amount of power from the rear facet 8 as from the front facet 7. In the stabilization configuration using WDMs 30, 40 in the embodiment of FIG. 1, the output of the rear facet 7 is not utilized, and if the bandpass of the outcoupler WDM 30 is not adequately matched to the SLD spectrum, some output loss may be incurred.

The second embodiment of the invention is illustrated in FIG. 2. As in FIG. 1, the SLD 10 is mounted on a TEC 12. An SLD driver current source 14 is used for driving the SLD 10, and without temperature control, the SLD temperature rises because of ohmic losses due to the applied current. As described above, a thermistor is typically used to sense the temperature and provides a signal to increase or decrease the output current of the TEC driver 16. However, as in the FIG. 1 embodiment, instead of controlling the temperature, the embodiment of FIG. 2 controls the wavelength directly.

Similar to FIG. 1(a), the output light from the front facet 7 is coupled to a fiber 20, which provides its output to the IFOG system. Thus, the full power from the rear facet 8 is available for use by the feedback and calibration system in accordance with the present invention. In FIG. 2, the light from the rear facet 8 is split into two components using a splitter 25, preferably a small cube beam splitter, and is provided to two detectors 55 and 60. Thus, in FIG. 2, there are no sidelobes as in FIG. 1, but a signal is used that has a highpass component that corresponds to the sidelobe $\lambda_1$ and a lowpass component that corresponds to the sidelobe $\lambda_2$.

The detector 55 has a lowpass filter 57 in front of it, and the detector 60 has a highpass filter 62 in front of it. The preferred cutoff wavelength of the lowpass filter 57 is approximately at or slightly below $\lambda_c$ and the preferred cutoff wavelength of the highpass filter 62 is approximately at or slightly above $\lambda_c$. It should be noted that bandpass filters can be used instead of the lowpass and highpass filters 57, 62 as long as the upper cutoff wavelength of the lower bandpass filter is at or below $\lambda_c$ and as long as the lower cutoff wavelength of the upper bandpass filter is at or slightly above $\lambda_c$. Also, the peak wavelength of the filters are preferably within the SLD spectrum with the lower bandpass filter having a peak response in the lower half of the SLD spectrum and the upper bandpass filter having a peak response in the upper half of the SLD spectrum. For example, if the SLD has a bandwidth of about 30 nm and $\lambda_c$ equals about 1550 nm, then the lower bandpass filter can be centered at about 1540 to 1545 nm and have an upper cutoff wavelength of about 1548 to 1550 nm. The upper bandpass filter can be centered at about 1555 to 1560 nm and have a lower cutoff wavelength of about 1550 to 1552 nm.

The filters 57, 62 can be directly mounted on the beam splitter 25 or deposited or affixed by other means, such as glue, to the detectors 55, 60. Thus, the upper and lower parts of the SLD spectrum are separated and detected; i.e., high and low bands are created, similar to the sidelobes described above with respect to FIG. 1. The outputs of the detectors 55, 60 are provided to a differential amplifier 50, which generates an error signal proportional to the difference between the total power received by the detectors 55, 60. The error signal is fed back to the SLD driver 14 and the TEC driver 16 to adjust the current provided to the SLD 10 and the TEC 12.

The operation of the system of FIG. 2 is similar to that of FIG. 1. The differential amplifier 50 is zeroed such that the IFOG output center wavelength is at the desired value at a given temperature. As the temperature or SLD current varies, the spectrum shifts, causing the relative outputs of the detectors 55, 60 to change, thereby unbalancing the differential amplifier 50. The output of the amplifier 50 is a positive or negative signal which is used as an error signal to control the SLD driver 14 and the TEC driver 16. The process is automatic and continues until the error signal returns to zero which indicates the condition of substantially perfect balance.

The system of FIG. 2 provides a temperature stability on the order of about 1 ppm or less over a broad temperature range at a low cost and is relatively easy to construct.

Many optical amplifier applications access both the front and rear facets 7, 8 of the SLD 10. In other words, the optical amplifier in many applications uses the light output from both facets 7, 8 of the SLD 10. An exemplary system for stabilizing the output spectrum and providing the light output from both facets 7, 8 for use by an optical amplifier is shown in FIG. 3. FIG. 3 contains elements similar to those described above with respect to FIGS. 1(a) and 2. These elements are labeled identically and their description is omitted for brevity.

Similar to FIG. 1(a), the output light from the front facet 7 is coupled to a fiber 20 to provide its output to the IFOG or other system. It should be noted that if the system does not use a fiber output for the light source, then the front fiber coupling is ignored. The output light from the rear facet is provided to a splitter 70, preferably a 90/10 splitter. In the preferred embodiment, about 10% of the light is passed to a splitter 25, preferably a 50/50 splitter, for processing as in the FIG. 2 embodiment, while about 90% of the light is passed through the 90/10 splitter 70 to a fiber 75 for use by the IFOG or an input device. The light from the splitter 70 is coupled to the fiber 75 by tapering the tip 73 of the fiber 75 and bringing the splitter 70 and the tip 73 to within a few microns of the SLD facet 8. Thus, both the front and rear facets 7, 8 provide light to the optical system and the rear facet also provides light for the calibration and feedback loop 52. It should be noted that instead of the tapered tip 73, butt coupling without a taper can be used although this is not as efficient. Moreover, a lens can be used between the SLD facet and the fiber 75 which provides high efficiency and a more relaxed position tolerance.

Optical amplifiers are used in repeaters, in tunable lasers, mode-locked lasers, and can be used in WDMs for large capacity fiber optic communication. In the particular cases of tunable and mode-locked lasers, it may be critical that the wavelength be stabilized to a high degree. The stabilization configuration described in FIG. 3 provides this capability.

Although illustrated and described herein with reference to certain specific embodiments, the present invention is nevertheless not intended to be limited to the details shown. Rather, various modifications may be made in the details within the scope and range of equivalents of the claims and without departing from the invention. Thus, the invention is not limited to the SLD of the type described herein. It should be noted that the invention may also be used with any light source having a measurable spectrum. Furthermore, the light source structure and system may be used in conjunction with other types of interferometric devices and with utilization devices other than interferometers.

I claim:

1. An apparatus, comprising:
   (a) a light source including a front end and a back end, the front end defining an output of the apparatus, the back end being used for wavelength stabilization, the light from the light source having a central wavelength;
   (b) a beam splitter provided in a light path from the back end of the light source and defining a first light path and a second light path;

(c) a first filter provided in the first light path, said first filter selected from the group consisting of a high-pass filter and a bandpass filter with a lower cutoff above the central wavelength;

(d) a second filter provided in the second light path, said second filter selected from the group consisting of a low-pass filter and a bandpass filter with an upper cutoff below the central wavelength; and (e) a differential amplifier with a first input operatively associated with said first filter, and a second input operatively associated with said second filter, and an output coupled to a driver associated with said light source.

2. The apparatus in claim 1, further comprising:

(e) a first detector operatively associated with said first filter and said first input; and (f) a second detector operatively associated with said second filter and said second input.

3. The apparatus in claim 2, wherein said light source includes:

(i) a super-luminescent diode (SLD);

(ii) an SLD driver coupled to said superluminescent diode, and coupled to the output from said differential amplifier;

(iii) a thermoelectric cooler (TEC); and (iv) a TEC driver coupled to said TEC, and coupled to the output from said differential amplifier.

4. An apparatus, comprising:

(a) a light source including a front end and a back end, the front end defining an output of the apparatus the back end being used for wavelength stabilization, the light from the light source having a central wavelength;

(b) a first means for filtering provided in a first light path from the back end of said light source;

(c) a second means for filtering provided in a second light path from the back end of said light source;

(d) a differential amplifier with a first input operatively associated with said first means for filtering, and a second input operatively associated with said second means for filtering, and an output coupled to said light source.

5. The apparatus in claim 4, further comprising:

(e) a first detector operatively disposed between said first means for filtering and said the first input of said differential amplifier; and (f) a second detector operatively disposed between said second means for filtering and the second input of said differential amplifier.

6. An optical feedback device for wavelength stabilization, comprising:

(a) a light source;

(b) a first filter having an input provided in a light path with said light source, and having an output, said first filter adapted to divide light emitted from said light source into a central bandwidth and a residual bandwidth containing a high component and a low component;

(c) a second filter having an input operatively associated with said first filter, and having an output, said second filter adapted to receive residual bandwidth from said first filter and separate the high component from the low component; and (d) a differential amplifier with a first input operatively associated with said second filter to receive the high component, and with a second input operatively associated with said second filter to receive the low component, said differential amplifier having an output coupled to said light source.

7. The optical feedback device of claim 6, wherein said first filter is a wavelength division multiplexer (WDM); and said second filter is selected from the group consisting of a WDM and a combination of high- and low-pass filters.

8. The optical feedback device of claim 6, further comprising:

(e) a first detector operatively associated with said second filter to receive the high component, and operatively associated with the first input of said differential amplifier; and (f) a second detector operatively associated with said second filter to receive the low component, and operatively associated with the second input of said differential amplifier.

9. An optical feedback device for wavelength stabilization, comprising:

(a) a light source;

(b) a first wavelength division multiplexer (WDM) that divides light emitted from said light source into a central bandwidth and a residual bandwidth containing a high component and a low component, said first WDM having an input provided in a light path with said light source, and having an output;

(c) a second WDM operatively associated with said first WDM to receive residual bandwidth from said first WDM and separate the high component from the low component; and (d) a differential amplifier with a first input operatively associated with said second WDM to receive the high component, and with a second input operatively associated with said second WDM to receive the low component, said differential amplifier having an output coupled to said light source.

10. An optical feedback system for wavelength stabilization, comprising:

(a) a light source;

(b) a means for selecting a central wavelength and two side wavelengths, one of the side wavelengths being above the central wavelength, and the other of the side wavelengths being below the central wavelength, said means for selecting disposed in a light path with said light source;

(c) a means for separating the side wavelengths disposed downstream in a light path with said means for selecting a central wavelength;

(d) a differential amplifier with a first input operatively associated with said means for separating to receive a first signal, and with a second input operatively associated with said means for separating to receive a second signal, and with an output coupled to said light source.

11. The optical feedback system of claim 10, further comprising:

(e) a first means for detecting operatively disposed between said second means for selecting and the first input of said differential amplifier; and (f) a second means for detecting operatively disposed between said second means for selecting and the second input of said differential amplifier.

12. A method for wavelength stabilization of a light source emitting light with a central wavelength a high component and a low component, the light source including a front end and a back end, the front end being used as a system output, the back end being used for wavelength stabilization, the light from the light source having a central wavelength; comprising:

(a) separating the high component from the low component emitted from the back end of the light source, the high component being above the central component, and the low component being below the central component;

(b) comparing the high component with the low component;

(c) sending to the light source, based on the comparison in (b), a feedback signal to wavelength stabilize the light source.

13. The method of claim 12, wherein the light source includes a super-luminescent diode (SLD), an SLD driver providing a drive current to the SLD, a themoelectric cooler (TEC), and a TEC driver supplying a drive current to the TEC, and wherein the feedback signal includes a signal fed back to the SLD driver and a signal fed back to the TEC driver to adjust the drive current provided to the SLD and the TEC.

14. The method of claim 13, further comprising:

(d) representing the high component as a high-component electrical signal and representing the low component as a low-component electrical signal;

and wherein said comparing includes comparing the high-component electrical signal with the low-component electrical signal.

15. The method of claim 13, wherein said separating includes sending a first portion of the emitted light through a low-pass filter, and sending a second portion of the light through a high-pass filter.

16. The method of claim 13, wherein said separating includes sending a first portion of the emitted light through a first bandpass filter, and sending a second portion of the light through a second bandpass filter.

17. The method of claim 13, wherein said separating includes sending the emitted light through a wavelength-division multiplexer.

* * * * *